United States Patent
Koreeda

(10) Patent No.: US 11,658,640 B2
(45) Date of Patent: May 23, 2023

(54) FILTER DEVICE AND MULTIPLEXER

(71) Applicant: Murata Manufacturing Co., Ltd., Nagaokakyo (JP)

(72) Inventor: Toshishige Koreeda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 237 days.

(21) Appl. No.: 16/929,169

(22) Filed: Jul. 15, 2020

(65) Prior Publication Data

US 2021/0119611 A1 Apr. 22, 2021

(30) Foreign Application Priority Data

Oct. 18, 2019 (JP) .............................. JP2019-191434

(51) Int. Cl.
*H03H 9/64* (2006.01)
*H03H 9/145* (2006.01)
*H03H 9/72* (2006.01)

(52) U.S. Cl.
CPC .......... *H03H 9/6483* (2013.01); *H03H 9/145* (2013.01); *H03H 9/72* (2013.01)

(58) Field of Classification Search
CPC ............ H03H 9/02; H03H 9/145; H03H 9/64; H03H 9/72
See application file for complete search history.

(56) References Cited

U.S. PATENT DOCUMENTS

| 10,069,476 | B2* | 9/2018 | Hara | H03H 9/6479 |
| 10,250,230 | B2* | 4/2019 | Ono | H03H 9/0576 |
| 10,404,234 | B2* | 9/2019 | Bi | H03H 9/68 |
| 10,447,239 | B2* | 10/2019 | Takahashi | H03H 9/02992 |

(Continued)

FOREIGN PATENT DOCUMENTS

| JP | 2017-204743 A | 11/2017 |
| JP | 2018-038040 A | 3/2018 |

(Continued)

OTHER PUBLICATIONS

Tuan et al., "Theoretical Calculation of Capacitance of an IDT Overa Piezoelectric Layered Structure", Apr. 1974, IEEE Transaction on Sonics and Ultrasonics, vol. SU-21, No. 2, 125-127 (Year: 1974).*

(Continued)

*Primary Examiner* — Hafizur Rahman
*Assistant Examiner* — Alan Wong
(74) *Attorney, Agent, or Firm* — Keating & Bennett, LLP

(57) ABSTRACT

A filter device includes a filter between an input/output terminal and an input/output terminal, and an additional circuit connected in parallel with the filter. The filter includes at least two acoustic wave resonators defining a pass band of the filter. The additional circuit includes a longitudinally coupled resonator, and a capacitor connected between the longitudinally coupled resonator and the input/output terminal. A capacitance of a comb-shaped capacitance electrode of the capacitor is smaller than a capacitance of an IDT electrode of at least one acoustic wave resonator of the at least two acoustic wave resonators, and an area of the comb-shaped capacitance electrode of the capacitor is smaller than an area of the IDT electrode of the at least one acoustic wave resonator.

19 Claims, 4 Drawing Sheets

(56) References Cited

U.S. PATENT DOCUMENTS

| | | |
|---|---|---|
| 2017/0331456 A1 | 11/2017 | Ono |
| 2018/0069529 A1 | 3/2018 | Bi et al. |
| 2018/0131348 A1 | 5/2018 | Takahashi |
| 2019/0199321 A1 | 6/2019 | Nosaka |

FOREIGN PATENT DOCUMENTS

| | | |
|---|---|---|
| JP | 2018-078489 A | 5/2018 |
| WO | 2018/051846 A1 | 3/2018 |

OTHER PUBLICATIONS

Fang et al., "Computation of capacitance and electrostatic forces for the electrostatically driving actuators considering fringe effects", Sep. 2014, MicrosystTechnol (Year: 2014).*

Zakaria et al., "Design and Fabrication of IDT SAW by Using Conventional Lithography Technique", 2013, Middle-East Journal of Scientific Research 18 (9), 1281-1285 (Year: 2013).*

* cited by examiner

FILTER DEVICE AND MULTIPLEXER

CROSS REFERENCE TO RELATED APPLICATIONS

This application claims the benefit of priority to Japanese Patent Application No. 2019-191434 filed on Oct. 18, 2019. The entire contents of this application are hereby incorporated herein by reference.

BACKGROUND OF THE INVENTION

1. Field of the Invention

The present invention relates to a filter device including an additional circuit and a multiplexer.

2. Description of the Related Art

In the past, it has been known that connecting a cancellation circuit that generates a signal having a phase opposite to and an amplitude identical to those of an unnecessary signal flowing through a filter in parallel with the filter improves attenuation characteristics or isolation characteristics of the filter. For example, Japanese Unexamined Patent Application Publication No. 2017-204743 discloses a duplexer having a cancellation circuit.

Since the cancellation circuit (referred to as an additional circuit in the present application) is connected in parallel with a filter, a signal corresponding to a pass band of the filter flowing through the filter leaks to the additional circuit, and a bandpass characteristic of the filter deteriorates.

SUMMARY OF THE INVENTION

Preferred embodiments of the present invention provide filter devices that are each capable of reducing or preventing deterioration in a bandpass characteristic due to an additional circuit.

A filter device according to a preferred embodiment of the present invention includes an acoustic wave filter provided between a first input/output terminal and a second input/output terminal, and an additional circuit connected in parallel with the acoustic wave filter between the first input/output terminal and the second input/output terminal, in which the acoustic wave filter includes at least two acoustic wave resonators defining a pass band of the acoustic wave filter, the additional circuit includes a phase shift circuit, and a first capacitor connected between the phase shift circuit and the first input/output terminal, the at least two acoustic wave resonators are each defined by a piezoelectric body and an IDT electrode including a plurality of electrode fingers provided on the piezoelectric body, the first capacitor is defined by the piezoelectric body and a comb-shaped capacitance electrode including a plurality of electrode fingers provided on the piezoelectric body, a capacitance of the comb-shaped capacitance electrode of the first capacitor is smaller than a capacitance of the IDT electrode of at least one acoustic wave resonator of the at least two acoustic wave resonators, and when a surface of the piezoelectric body on which the IDT electrode and the comb-shaped capacitance electrode are provided is viewed in plan, an area of the comb-shaped capacitance electrode of the first capacitor is smaller than an area of the IDT electrode of the at least one acoustic wave resonator.

A multiplexer according to a preferred embodiment of the present invention includes a plurality of filters including the filter device described above, and an input terminal or an output terminal of the plurality of filters is connected to a common terminal.

A multiplexer according to a preferred embodiment of the present invention includes a transmission filter provided between a first input terminal and a first output terminal, a reception filter provided between a second input terminal and a second output terminal, and an additional circuit provided between the first input terminal and the second output terminal, in which the first output terminal and the second input terminal are connected to a common terminal, the transmission filter includes at least two transmission side acoustic wave resonators defining a pass band of the transmission filter, the reception filter includes at least two reception side acoustic wave resonators defining a pass band of the reception filter, the additional circuit includes a phase shift circuit, and a third capacitor provided either between the phase shift circuit and the first input terminal or between the phase shift circuit and the second output terminal, the at least two transmission side acoustic wave resonators are each defined by a piezoelectric body and an IDT electrode including a plurality of electrode fingers provided on the piezoelectric body, the at least two reception side acoustic wave resonators are each defined by the piezoelectric body and an IDT electrode including a plurality of electrode fingers provided on the piezoelectric body, the third capacitor is defined by the piezoelectric body and a comb-shaped capacitance electrode including a plurality of electrode fingers provided on the piezoelectric body, a capacitance of the comb-shaped capacitance electrode of the third capacitor is smaller than a capacitance of the IDT electrode of at least one acoustic wave resonator of the at least two transmission side acoustic wave resonators and the at least two reception side acoustic wave resonators, and when a surface of the piezoelectric body on which the IDT electrode and the comb-shaped capacitance electrode are provided is viewed in plan, an area of the comb-shaped capacitance electrode of the third capacitor is smaller than an area of the IDT electrode of the at least one acoustic wave resonator.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
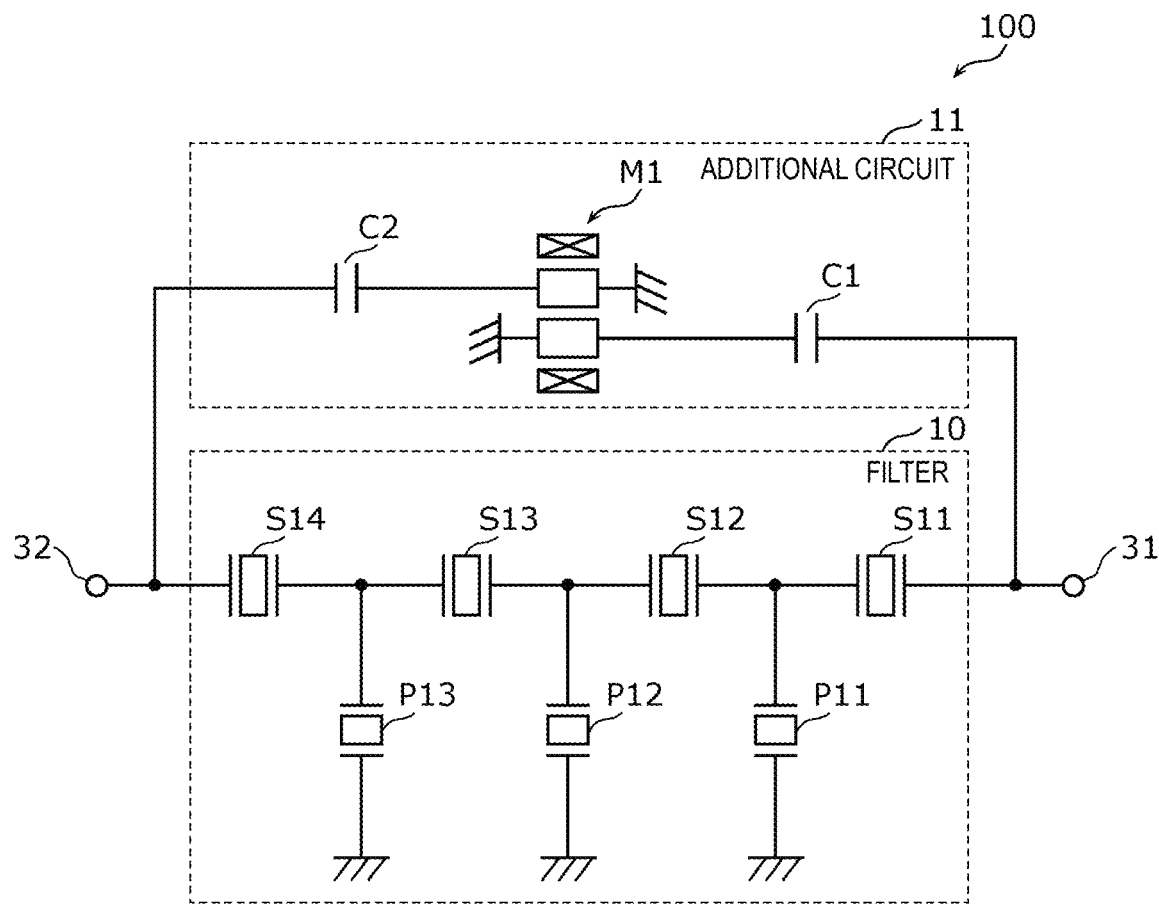
FIG. 1 is a diagram illustrating an example of a filter device according to Preferred Embodiment 1 of the present invention.

Hereinafter, preferred embodiments of the present invention will be described in detail with reference to the accompanying drawings. Note that, each of the preferred embodiments described below represents a general or specific example. Numerical values, shapes, materials, elements, arrangement and connection configurations of the elements, and the like described in the following preferred embodiments are merely examples and are not intended to limit the present invention. Among the elements in the following preferred embodiments, elements that are not described in the independent claims will be described as optional elements. Moreover, sizes or size ratios of the elements illustrated in the drawings are not necessarily strict. In addition, in the drawings, the same reference numerals are given to the same or substantially the same configurations, and redundant description may be omitted or simplified in some cases. In addition, in the following preferred embodiments, a term "connected" includes not only a case of being directly connected, but also a case of being electrically connected with another element or the like interposed therebetween.

Preferred Embodiment 1

Preferred Embodiment 1 of the present invention will be described with reference to FIG. 1 to FIG. 6.

FIG. 1 is a diagram illustrating an example of a filter device 100 according to Preferred Embodiment 1.

The filter device 100 includes an input/output terminal that is a first input/output terminal and an input/output terminal 32 that is a second input/output terminal. For example, the input/output terminal 32 is connected to an antenna element, and the input/output terminal 31 is connected to an RF signal processing circuit (RFIC) with a switch IC, an amplifier circuit, or the like interposed therebetween. The filter device 100 transmits a high-frequency signal between the antenna element and the RF signal processing circuit.

The filter device 100 may define and function a transmission filter that transmits a high-frequency transmission signal from the RF signal processing circuit to the antenna element, or may define and function as a reception filter that transmits a high-frequency reception signal from the antenna element to the RF signal processing circuit.

When the filter device 100 defines and functions as the transmission filter, the input/output terminal 31 defines and functions as an input terminal, the input/output terminal 32 defines and functions as an output terminal, and when the filter device 100 defines and functions as the reception filter, the input/output terminal 31 defines and functions as an output terminal and the input/output terminal 32 defines and functions as an input terminal.

Note that, the RF signal processing circuit may be connected to the input/output terminal 32, and the antenna element may be connected to the input/output terminal 31. In this case, when the filter device 100 defines and functions as a transmission filter, the input/output terminal 31 defines and functions as an output terminal, the input/output terminal 32 defines and functions as an input terminal, and when the filter device 100 defines and functions as a reception filter, the input/output terminal 31 defines and functions as an input terminal and the input/output terminal 32 defines and functions as an output terminal.

The filter device 100 includes a filter 10 and an additional circuit 11.

The filter 10 is an acoustic wave filter provided between the input/output terminal 31 and the input/output terminal 32. An acoustic wave filter is a filter including an acoustic wave resonator. The filter 10 includes at least two acoustic wave resonators defining a pass band of the filter 10. The at least two acoustic wave resonators are each defined by a piezoelectric body and an IDT electrode including a plurality of electrode fingers provided on the piezoelectric body. Here, the filter 10 includes, as the at least two acoustic wave resonators, series arm resonators S11, S12, S13, and S14, and parallel arm resonators P11, P12, and P13. The series arm resonators S11, S12, S13, and S14 are disposed on a path connecting the input/output terminal 31 and the input/output terminal 32, and are connected in series with each other. The parallel arm resonator P11 is connected between a connection node between the series arm resonator S11 and the series arm resonator S12, and a ground. The parallel arm resonator P12 is connected between a connection node between the series arm resonator S12 and the series arm resonator S13, and the ground. The parallel arm resonator P13 is connected between a connection node between the series arm resonator S13 and the series arm resonator S14, and the ground.

Note that, the number of the series arm resonators and the number of the parallel arm resonators in the filter 10 need not be those illustrated in FIG. 1, and it is sufficient that the filter 10 includes at least two series arm resonators, at least two parallel arm resonators, or at least one series arm resonator and at least one parallel arm resonator.

The additional circuit 11 is a circuit connected in parallel with the filter 10 between the input/output terminal 31 and the input/output terminal 32, and generates a signal that has a phase opposite to that of an unnecessary signal flowing through the filter 10, and that is a cancellation signal to cancel the unnecessary signal component. Here, one signal having a phase opposite to that of another signal means that an absolute value of a phase difference between the signals is larger than about 90° in a range of about −180° or more and about 180° or less. This is equivalent to both of the signals having respective phase components in directions opposite to each other. Note that, the cancellation signal preferably has the same amplitude as that of the unnecessary signal as much as possible, but the amplitudes may be different from each other. When an amplitude of a sum result of the cancellation signal and the unnecessary signal is smaller than the amplitude of the original unnecessary signal in accordance with a phase difference between both the signals, it is possible to improve attenuation characteristics of the filter 10. When the additional circuit 11 is connected in parallel with the filter 10, the unnecessary signal that flows through the filter 10 is canceled by the cancellation signal generated by the additional circuit 11 at a connection point between the filter 10 and the additional circuit 11. This improves attenuation characteristics or isolation characteristics of the filter 10.

Note that, the case where the additional circuit 11 and the filter 10 are connected in parallel includes a case where the additional circuit 11 is connected in parallel with some acoustic wave resonators of the at least two acoustic wave resonators defining the filter 10. For example, a capacitor C1 of the additional circuit 11 need not be connected to a node between the input/output terminal 31 and the series arm resonator S11, and may be connected to the node between the series arm resonator S11 and the series arm resonator S12, the node between the series arm resonator S12 and the series arm resonator S13, or the node between the series arm resonator S13 and the series arm resonator S14. Further, a capacitor C2 of the additional circuit 11 need not be connected to a node between the input/output terminal 32 and the series arm resonator S14, and may be connected to the node between the series arm resonator S14 and the series arm resonator S13, the node between the series arm resonator S13 and the series arm resonator S12, or the node between the series arm resonator S12 and the series arm resonator S11.

The additional circuit 11 includes a longitudinally coupled resonator M1 that is a phase shift circuit, and the capacitor C1 that is a first capacitor connected between the input/output terminal 31 and the longitudinally coupled resonator M1. In addition, the additional circuit 11 further includes the capacitor C2 that is a second capacitor connected between the longitudinally coupled resonator M1 and the input/output terminal 32. The longitudinally coupled resonator M1 and the capacitors C1 and C2 are configured to generate a cancellation signal.

The capacitors C1 and C2 are elements that, in order to generate a cancellation signal having an identical or substantially an identical amplitude to that of an unnecessary signal flowing through the filter 10, adjust (specifically, reduce) the amplitude of an inputted signal. The capacitors C1 and C2 are each defined by a piezoelectric body and a comb-shaped capacitance electrode including a plurality of electrode fingers provided on the piezoelectric body.

The longitudinally coupled resonator M1 is a phase shift circuit that, in order to generate a cancellation signal having a phase opposite to and an amplitude identical or substantially identical to those of an unnecessary signal, adjusts the amplitude and a phase of an inputted signal. Note that, the additional circuit 11 may include, for example, instead of the longitudinally coupled resonator M1, as a phase shift circuit, a transversal filter that transmits a signal by utilizing propagation of an acoustic wave, or may include an acoustic wave delay line that delays the phase. That is, the phase shift circuit is not particularly limited as long as the phase shift circuit is a circuit capable of adjusting the phase.

The respective comb-shaped capacitance electrodes defining the capacitors C1 and C2 and the respective IDT electrode defining the at least two acoustic wave resonators in the filter 10 are provided on the same piezoelectric body with each other. Note that, the longitudinally coupled resonator M1 may also be provided on the same piezoelectric body.

Figure 2:
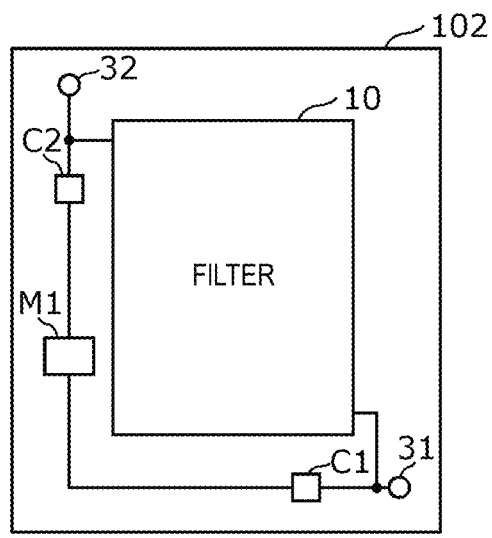
FIG. 2 is a diagram schematically illustrating an acoustic wave filter and an additional circuit provided on the same piezoelectric body.
Figure 3:
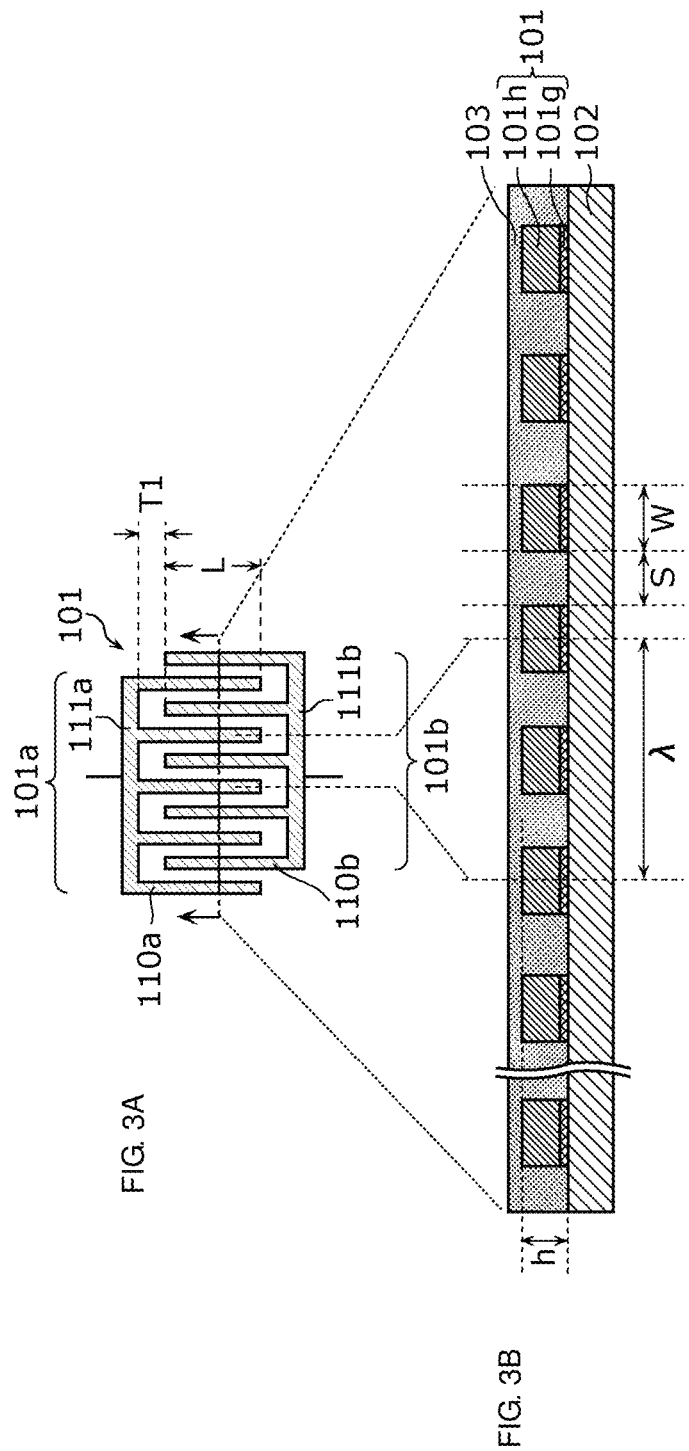
FIG. 3A is a plan view and FIG. 3B is a sectional view, both schematically illustrating an example of an acoustic wave resonator.

FIG. 2 is a diagram schematically illustrating the acoustic wave filter (filter 10) and the additional circuit 11 provided on the same piezoelectric body 102. Note that, FIG. 2 schematically illustrates, as the additional circuit 11, the capacitors C1 and C2 and the longitudinally coupled resonator M1 as elements of the additional circuit 11. Further, in FIG. 2, the at least two acoustic wave resonators defining the filter 10 are not illustrated.

As illustrated in FIG. 2, it can be seen that the filter 10 and the additional circuit 11 (specifically, the capacitors C1 and C2 and the longitudinally coupled resonator M1) are provided on the same piezoelectric body 102. Further, it can be seen that a ratio of an area occupied by the elements of the additional circuit 11 on the piezoelectric body 102 is considerably smaller than a ratio of an area occupied by the elements of the filter 10. Since the at least two acoustic wave resonators and the capacitors C1 and C2 are provided on the piezoelectric body 102, the at least two acoustic wave resonators and the capacitors C1 and C2 can be manufactured in the same process.

Here, the structure of the at least two acoustic wave resonators will be described with reference to FIGS. 3A and 3B.

FIG. 3A is a plan view and FIG. 3B is a sectional view, both schematically illustrating an example of the acoustic wave resonators. Note that, the acoustic wave resonator illustrated in FIGS. 3A and 3B is for describing typical structure of each acoustic wave resonator that defines the filter device 100. For this reason, the number, a length, and the like of electrode fingers defining an IDT electrode of each the acoustic wave resonator of the filter device 100 are not limited to the number and a length of electrode fingers of an IDT electrode illustrated in FIGS. 3A and 3B. Note that, in FIGS. 3A and 3B, a reflector of an acoustic wave resonator is not illustrated.

As illustrated in FIGS. 3A and 3B, the acoustic wave resonator includes an IDT electrode 101, a piezoelectric body 102 on which the IDT electrode 101 is provided, and a protective layer 103 covering the IDT electrode 101. Hereinafter, these elements will be described in detail.

As illustrated in FIG. 3A, a pair of comb-shaped electrodes 101a and 101b facing each other, that define the IDT electrode 101 is provided on the piezoelectric body 102. The comb-shaped electrode 101a includes a plurality of electrode fingers 110a parallel or substantially parallel to each other and a busbar electrode 111a that connects the plurality of electrode fingers 110a. Additionally, the comb-shaped electrode 101b includes a plurality of electrode fingers 110b parallel or substantially parallel to each other and a busbar electrode 111b that connects the plurality of electrode fingers 110b.

Note that, each of the comb-shaped electrodes 101a and 101b may be referred to as an IDT electrode by itself. However, hereinafter, for the sake of convenience, description will be provided assuming that the one IDT electrode 101 includes the pair of comb-shaped electrodes 101a and 101b.

In addition, the IDT electrode 101 including the plurality of electrode fingers 110a and 110b and the busbar electrodes 111a and 111b has a laminated structure including an adhesion layer 101g and a main electrode layer 101h, as illustrated in FIG. 3B.

The adhesion layer 101g improves adhesiveness between the piezoelectric body 102 and the main electrode layer 101h, and for example, Ti is preferably used as a material thereof.

As a material of the main electrode layer 101h, for example, Al including about 1% of Cu is preferably used.

The protective layer 103 covers the comb-shaped electrodes 101a and 101b. The protective layer 103 protects the main electrode layer 101h from an external environment, adjusts frequency temperature characteristics, improves moisture resistance, and the like, and is preferably, for example, a film including silicon dioxide as a main component.

Note that, the respective materials of the adhesion layer 101g, the main electrode layer 101h, and the protective layer 103 are not limited to the above-described materials. Further, the IDT electrode 101 need not have the above-described laminated structure. The IDT electrode 101 may be made of, for example, metal or alloy of Ti, Al, Cu, Pt, Au, Ag, Pd, or the like, or may include a plurality of laminated bodies made of the above-described metal or alloy. Further, it is also possible that the adhesion layer 101g and the protective layer 103 are not provided.

The piezoelectric body 102 may be a piezoelectric substrate made of, for example, a $LiTaO_3$ piezoelectric single crystal, a LiNbO₃ piezoelectric single crystal, a KNbO₃ piezoelectric single crystal, crystal, or piezoelectric ceramics.

Further, the piezoelectric body 102 may be a piezoelectric substrate having a laminated structure in which, for example, a high acoustic velocity support substrate, a low acoustic velocity film, and a piezoelectric film are laminated in this order. The piezoelectric film is preferably made of, for example, a 42° Y cut X-propagation LiTaO₃ piezoelectric single crystal or piezoelectric ceramics. The high acoustic velocity support substrate supports the low acoustic velocity film, the piezoelectric film, and the IDT electrode. The high acoustic velocity support substrate, additionally, is a substrate in which acoustic velocity of a bulk wave in the high acoustic velocity support substrate is higher than that of an acoustic wave such as a surface acoustic wave or a boundary wave propagating through the piezoelectric film, and confines a surface acoustic wave to a portion where the piezoelectric film and the low acoustic velocity film are laminated, and prevents the surface acoustic wave from leaking below the high acoustic velocity support substrate. The high acoustic velocity support substrate is preferably, for example, a silicon substrate. The low acoustic velocity film is a film in which acoustic velocity of a bulk wave in the low acoustic velocity film is lower than that of a bulk wave that propagates through the piezoelectric film, and is disposed between the piezoelectric film and the high acoustic velocity support substrate. The above-described structure and a nature of an acoustic wave that energy essentially concentrates in a low acoustic velocity medium reduce or prevent leakage of surface acoustic wave energy to the outside of the IDT electrode. The low acoustic velocity film is preferably, for example, a film including silicon dioxide as a main component. Note that, a bonding layer made of, for example, Ti, Ni, or the like may be included inside the low acoustic velocity film. The low acoustic velocity film may have a multi-layer structure including a plurality of low acoustic velocity materials. According to the laminated structure, a Q value at a resonant frequency and an anti-resonant frequency can be significantly increased, compared to a structure in which the piezoelectric body 102 is used as a single layer. That is, since a surface acoustic wave resonator having a high Q value can be provided, it is possible to provide a filter having a small insertion loss by using the surface acoustic wave resonator.

Note that, the high acoustic velocity support substrate may have structure in which a support substrate and a high acoustic velocity film in which acoustic velocity of a bulk wave propagating therethrough is higher than that of an acoustic wave such as a surface acoustic wave or a boundary wave propagating through the piezoelectric film are laminated. In this case, for the support substrate, it is possible to use piezoelectric bodies, such as, for example, lithium tantalate, lithium niobate, and quartz, various ceramics such as alumina, magnesia, silicon nitride, aluminum nitride, silicon carbide, zirconia, cordierite, mullite, steatite, and forsterite, dielectrics such as glass and sapphire, or semiconductors such as silicon and gallium nitride, and a resin substrate, and the like. Additionally, for the high acoustic velocity film, various high acoustic velocity materials can be used, such as, for example, aluminum nitride, aluminum oxide, silicon carbide, silicon nitride, silicon oxynitride, a DLC film, or diamond, a medium containing the above-mentioned material as a main component, and a medium including a mixture of the above materials as a main component, and the like.

In the acoustic wave resonator configured as described above, a wavelength of an excited acoustic wave, a capacitance of the IDT electrode 101, and the like are defined by design parameters of the IDT electrode 101 and the like. Hereinafter, the design parameters of the IDT electrode 101, that is, design parameters of the comb-shaped electrode 101a and the comb-shaped electrodes 101b will be described.

A wavelength of an acoustic wave is defined by a repetition period λ of the plurality of electrode fingers 110a and 110b of the comb-shaped electrodes 101a and 101b illustrated in FIGS. 3A and 3B. Additionally, an electrode pitch (electrode period) is about ½ of the repetition period λ, and is defined as W+S where a line width of each of the electrode fingers 101a and 101b of the comb-shaped electrode 110a and 110b respectively is W and a gap between the electrode fingers 110a and 110b adjacent to each other is S. Additionally, an intersecting width L of the IDT electrode 101 is an overlapping electrode finger length, when the electrode finger 110a of the comb-shaped electrode 101a and the electrode finger 110b of the comb-shaped electrode 101b are viewed from a left-right direction in FIGS. 3A and 3B. Further, an electrode duty (duty ratio) is the proportion of the line width of the plurality of electrode fingers 110a and 110b, and is a ratio of the line width to the sum of the line width of the plurality of electrode fingers 110a and 110b and a gap between the plurality of electrode fingers 110a and 110b, and is defined by W/(W+S). In addition, the number of pairs refers to the number of pairs of electrode fingers 110a and electrode fingers 110b, of the comb-shaped electrode 101a and 101b, and is approximately half a total number of the electrode fingers 110a and the electrode fingers 110b. Further, a gap between a tip portion of the plurality of electrode fingers of the IDT electrode 101 and the busbar electrode facing the tip portion is defined as T1. Additionally, a film thickness of the IDT electrode 101 is a thickness h of the plurality of electrode fingers 110a and 110b. A capacitance of the IDT electrode 101 is defined by the gap S or the gap T1. That is, as the gap S increases or the gap T1 increases, the capacitance of the IDT electrode decreases. Note that, since there is a relationship that the gap S increases as the line width W decreases, the capacitance of the IDT electrode 101 can be defined by the line width W, and as the line width W decreases, the capacitance of the IDT electrode decreases. Further, since there is a relationship that the gap T1 increases as the intersecting width L decreases, the capacitance of the IDT electrode 101 can be defined by the intersecting width L as well, and as the intersecting width L decreases, the capacitance of the IDT electrode decreases.

Note that, a dummy electrode may be provided on a side of the electrode finger of the busbar electrode. This will be described with reference to FIG. 4.

Figure 4:
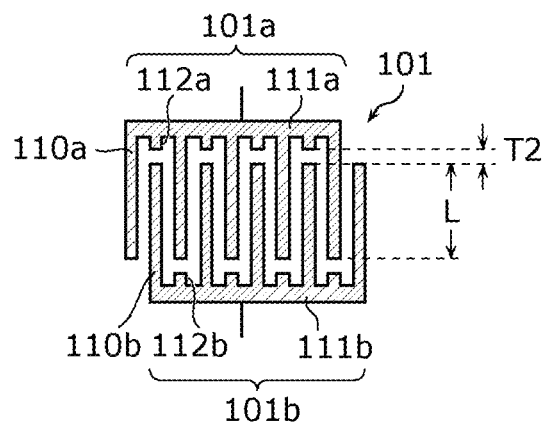
FIG. 4 is a plan view schematically illustrating another example of the acoustic wave resonator.

FIG. 4 is a plan view schematically illustrating another example of the acoustic wave resonator. In the acoustic wave resonator illustrated in FIG. 4, a dummy electrode 112a that extends from the busbar electrode 111a toward the side of the electrode finger 110b and a dummy electrode 112b that extends from the busbar electrode 111b toward the side of the electrode finger 110a are provided. Points other than the above are the same or substantially the same as those of the acoustic wave resonator illustrated in FIGS. 3A and 3B, thus description thereof will be omitted.

A gap between a tip portion of the plurality of electrode fingers of the IDT electrode 101 and the dummy electrode facing the tip portion is defined as T2. In this case, the capacity of the IDT electrode 101 can be defined by the gap T2 as well, and as the gap T2 increases, the capacitance of the IDT electrode decreases.

Note that, in the present preferred embodiment, since the basic structure of each of the capacitors C1 and C2 is the same as or similar to that of the acoustic wave resonator, the structure of each of the capacitors C1 and C2 is not illustrated, and the acoustic wave resonators in the description of FIGS. 3A, 3B, and FIG. 4 can be replaced with the capacitors C1 and C2, and the IDT electrode can be replaced with a comb-shaped capacitance electrode. However, since the comb-shaped capacitance electrode of each of the capacitors C1 and C2 is not intended to excite an acoustic wave, an acoustic wave need not be excited in the comb-shaped capacitance electrode forming each of the capacitors C1 and C2.

The additional circuit 11 can cancel an unnecessary signal flowing through the filter 10, thus improving the attenuation characteristics or the isolation characteristics of the filter 10. On the other hand, the additional circuit 11 is connected in parallel with the filter 10, thus a signal corresponding to the pass band of the filter 10 flowing through the filter 10 leaks to the additional circuit 11, and a bandpass characteristic of the filter 10 may deteriorate.

Thus, in the present preferred embodiment, a capacitance of the comb-shaped capacitance electrode defining the capacitor C1 is smaller than a capacitance of an IDT electrode defining at least one acoustic wave resonator of the at least two acoustic wave resonators included in the filter 10. In order to reduce the capacitance of the comb-shaped capacitance electrode, when a surface of the piezoelectric body 102 on which the IDT electrode and the comb-shaped capacitance electrode are provided is viewed in plan, an area of the comb-shaped capacitance electrode defining the capacitor C1 is smaller than an area of the IDT electrode defining the at least one acoustic wave resonator. Note that, the area of the comb-shaped capacitance electrode and the area of the IDT electrode are determined by a product of the intersecting width L illustrated in FIG. 3A and FIG. 4 and the number of pairs of the electrode fingers.

The at least one acoustic wave resonator for the capacitor C1 includes, for example, an acoustic wave resonator connected closest to the capacitor C1 of the at least two acoustic wave resonators, and specifically includes the series arm resonator S11. That is, the capacitance of the comb-shaped capacitance electrode defining the capacitor C1 is smaller than the capacitance of an IDT electrode defining the series arm resonator S11, and the area of the comb-shaped capacitance electrode defining the capacitor C1 is smaller than an area of the IDT electrode defining the series arm resonator S11.

Figure 5:
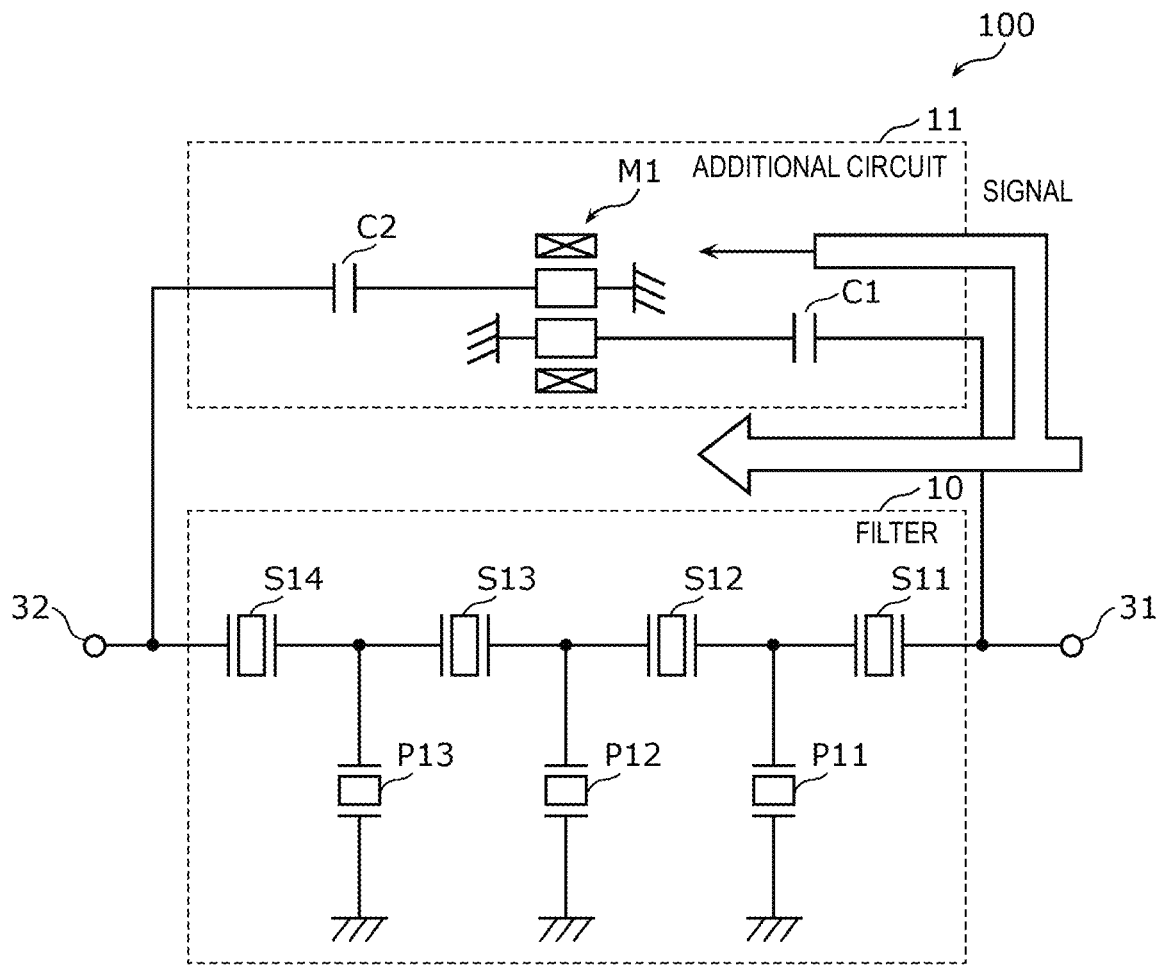
FIG. 5 is a diagram for explaining the magnitude of a signal in the filter device according to Preferred Embodiment 1 of the present invention.

As described above, the capacitance of the comb-shaped capacitance electrode defining the capacitor C1 is smaller than the capacitance of the IDT electrode defining the series arm resonator S11, and thus, the magnitude of a signal in the filter device 100 is as illustrated in FIG. 5.

FIG. 5 is a diagram for explaining the magnitude of a signal in the filter device 100 according to Preferred Embodiment 1. In FIG. 5, the magnitude of the signal is expressed by respective thicknesses of arrows.

As illustrated in FIG. 5, a signal corresponding to the pass band of the filter 10 inputted to the input/output terminal flows through the filter 10, and also flows toward the additional circuit 11 connected in parallel with the filter 10. At this time, since the capacitance of the comb-shaped capacitance electrode defining the capacitor C1 is small, the signal is less likely to flow through the additional circuit 11 on the side of the longitudinally coupled resonator M1 with respect to the capacitor C1. This is because the capacitance of the comb-shaped capacitance electrode defining the capacitor C1 is small, and thus impedance of the capacitor C1 is large.

As described above, the capacitance of the comb-shaped capacitance electrode defining the capacitor C1 is small, and thus a signal corresponding to the pass band of the filter 10 flowing through the filter 10 is less likely to leak to the additional circuit 11, and deterioration in the bandpass characteristic due to the additional circuit 11 can be reduced or prevented.

Further, in the present preferred embodiment, the capacitance of a comb-shaped capacitance electrode defining the capacitor C2 is smaller than the capacitance of the IDT electrode defining the at least one acoustic wave resonator of the at least two acoustic wave resonators included in the filter 10. In order to reduce the capacitance of the comb-shaped capacitance electrode, when the surface of the piezoelectric body 102 on which the IDT electrode and the comb-shaped capacitance electrode are provided is viewed in plan, an area of the comb-shaped capacitance electrode defining the capacitor C2 is smaller than the area of the IDT electrode defining the at least one acoustic wave resonator.

At least one acoustic wave resonator for the capacitor C2 includes, for example, an acoustic wave resonator connected closest to the capacitor C2 of the at least two acoustic wave resonators, and specifically includes the series arm resonator S14. That is, the capacitance of the comb-shaped capacitance electrode defining the capacitor C2 is smaller than a capacitance of an IDT electrode defining the series arm resonator S14, and the area of the comb-shaped capacitance electrode defining the capacitor C2 is smaller than an area of the IDT electrode defining the series arm resonator S14.

As described above, the capacitance of the comb-shaped capacitance electrode defining the capacitor C2 is smaller than the capacitance of the IDT electrode defining the series arm resonator S14, and thus a signal corresponding to the pass band of the filter 10 inputted to the input/output terminal 31 is further less likely to flow through the additional circuit 11 on the side of the longitudinally coupled resonator M1 with respect to the capacitor C1 by the two capacitors C1 and C2 each having small capacitance. Accordingly, a signal corresponding to the pass band of the filter 10 flowing through the filter 10 is further less likely to leak to the additional circuit 11, and thus the deterioration in the bandpass characteristic due to the additional circuit 11 can be further reduced or prevented.

In the present preferred embodiment, as described above, the respective comb-shaped capacitance electrodes defining the capacitors C1 and C2 and the IDT electrode defining the at least one acoustic wave resonator are provided in the same piezoelectric body, and are manufactured in the same process. That is, manufacturing variations for the respective comb-shaped capacitance electrodes defining the capacitors C1 and C2, and the IDT electrode defining the at least one acoustic wave resonator are the same or substantially the same. For example, when the manufacturing variation for the IDT electrode defining the at least one acoustic wave resonator is about ±0.1 μm, the manufacturing variation for the respective comb-shaped capacitance electrodes defining the capacitors C1 and C2 is also about ±0.1 μm. As described above, since the area of each of the respective comb-shaped capacitance electrodes defining the capacitors C1 and C2 is smaller than the area of the IDT electrode defining the at least one acoustic wave resonator of the filter 10, the influence of the manufacturing variation for the comb-shaped capacitance electrodes having the small area is larger than the influence of the manufacturing variation for the IDT electrode having the large area. Thus, due to the influence by the manufacturing variations, the capacitance of the respective comb-shaped capacitance electrodes defining the capacitors C1 and C2 may vary greatly, and a cancellation signal generated by the additional circuit 11 may not be an exact signal as designed, and an improvement of the attenuation characteristics or the isolation characteristics by the additional circuit 11 may deteriorate.

Thus, for example, a gap between electrode fingers adjacent to each other of the comb-shaped capacitance electrode defining the capacitor C1 may be larger than a gap between electrode fingers adjacent to each other of the IDT electrode defining the at least one acoustic wave resonator. The gap between the adjacent electrode fingers of the comb-shaped capacitance electrode and the gap between the adjacent electrode fingers of the IDT electrode correspond to S in FIG. 3B. Note that, a method of increasing the gap is not particularly limited, and for example, the repetition period $\lambda$ illustrated in FIGS. 3A and 3B may be increased to increase the gap, or the line width W illustrated in FIG. 3B may be decreased to increase the gap.

The at least one acoustic wave resonator for the capacitor C1 includes, for example, the acoustic wave resonator connected closest to the capacitor C1 of the at least two acoustic wave resonators, and specifically includes the series arm resonator S11. That is, the gap between adjacent electrode fingers of the comb-shaped capacitance electrode defining the capacitor C1 may be larger than a gap between adjacent electrode fingers of the IDT electrode defining the series arm resonator S11.

Since the gap between the adjacent electrode fingers of the comb-shaped capacitance electrode defining the capacitor C1 is large, the influence of the manufacturing variations that is a fixed value decreases. For example, when the gap is about 1 µm, the influence of the manufacturing variations of about ±0.1 µm will be about 10% for the gap, that is, the capacitance may shift by about 10%, whereas when the gap is about 2 µm, the influence of the manufacturing variations of about ±0.1 µm decreases to about 5% for the gap.

As described above, since the gap between the adjacent electrode fingers of the comb-shaped capacitance electrode defining the capacitor C1 is large, the capacitance of the comb-shaped capacitance electrode defining the capacitor C1 is less likely to shift with respect to a design value, in other words, it is easy to generate a cancellation signal that exactly matches a design value, and deterioration in the improvement of the attenuation characteristics or the isolation characteristics due to the additional circuit 11 can be reduced or prevented.

Further, for example, a gap between a tip portion of the plurality of electrode fingers of the comb-shaped capacitance electrode defining the capacitor C1 and a busbar electrode facing the tip portion may be larger than a gap between a tip portion of the plurality of electrode fingers of the IDT electrode defining the at least one acoustic wave resonator and a busbar electrode facing the tip portion. The gap between the tip portion of the plurality of electrode fingers of the comb-shaped capacitance electrode and the busbar electrode facing the tip portion and the gap between the tip portion of the plurality of electrode fingers of the IDT electrode and the busbar electrode facing the tip portion correspond to T1 in FIG. 3A. Note that, a method of increasing the gap is not particularly limited, and for example, the intersecting width L illustrated in FIG. 3A may be reduced to increase the gap, or each of the busbar electrodes 111a and 111b illustrated in FIG. 3A may be separated from the tip portion of the electrode fingers to increase the gap.

The at least one acoustic wave resonator for the capacitor C1 includes, for example, the acoustic wave resonator connected closest to the capacitor C1 of the at least two acoustic wave resonators, and specifically includes the series arm resonator S11. That is, the gap between the tip portion of the plurality of electrode fingers of the comb-shaped capacitance electrode defining the capacitor C1 and the busbar electrode facing the tip portion may be larger than a gap between a tip portion of the plurality of electrode fingers of the IDT electrode defining the series arm resonator S11 and a busbar electrode facing the tip portion.

Since the gap between the tip portion of the plurality of electrode fingers of the comb-shaped capacitance electrode defining the capacitor C1 and the busbar electrode facing the tip portion is large, the influence of the manufacturing variations that is a fixed value decreases.

As described above, since the gap between the tip portion of the plurality of electrode fingers of the comb-shaped capacitance electrode defining the capacitor C1 and the busbar electrode facing the tip portion is large, the capacitance of the comb-shaped capacitance electrode defining the capacitor C1 is less likely to shift with respect to the design value, in other words, it is easy to generate a cancellation signal that exactly matches a design value, and the deterioration in the improvement of the attenuation characteristics or the isolation characteristics due to the additional circuit 11 can be reduced or prevented.

Further, for example, a gap between the tip portion of the plurality of electrode fingers of the comb-shaped capacitance electrode defining the capacitor C1 and a dummy electrode facing the tip portion may be larger than a gap between the tip portion of the plurality of electrode fingers of the IDT electrode defining the at least one acoustic wave resonator and a dummy electrode facing the tip portion. The gap between the tip portion of the plurality of electrode fingers of the comb-shaped capacitance electrode and the dummy electrode facing the tip portion and the gap between the tip of the plurality of electrode fingers of the IDT electrode and the dummy electrode facing the tip correspond to T2 in FIG. 4. Note that, a method of increasing the gap is not particularly limited, and for example, the intersecting width L illustrated in FIG. 4 may be reduced to increase the gap, or the dummy electrodes 112a and 112b illustrated in FIG. 4 may be reduced to increase the gap, or each of the busbar electrodes 111a and 111b may be separated from the tip portion of the electrode fingers to increase the gap.

The at least one acoustic wave resonator for the capacitor C1 includes, for example, the acoustic wave resonator connected closest to the capacitor C1 of the at least two acoustic wave resonators, and specifically includes the series arm resonator S11. That is, the gap between the tip portion of the plurality of electrode fingers of the comb-shaped capacitance electrode defining the capacitor C1 and the dummy electrode facing the tip portion may be larger than a gap between the tip portion of the plurality of electrode fingers of the IDT electrode defining the series arm resonator S11 and a dummy electrode facing the tip portion.

Since the gap between the tip portion of the plurality of electrode fingers of the comb-shaped capacitance electrode defining the capacitor C1 and the dummy electrode facing the tip portion is large, the influence of the manufacturing variations that is a fixed value decreases.

As described above, since the gap between the tip portion of the plurality of electrode fingers of the comb-shaped capacitance electrode defining the capacitor C1 and the dummy electrode facing the tip portion is large, the capacitance of the comb-shaped capacitance electrode defining the capacitor C1 is less likely to shift with respect to the design value, in other words, it makes easy to generate a cancellation signal that exactly matches a design value, and the deterioration in the improvement function of the attenuation characteristics or the isolation characteristics due to the additional circuit 11 can be reduced or prevented.

Further, for example, a gap between electrode fingers adjacent to each other of the comb-shaped capacitance electrode defining the capacitor C2 may be larger than a gap between electrode fingers adjacent to each other of the IDT electrode defining the at least one acoustic wave resonator.

At least one acoustic wave resonator for the capacitor C2 includes, for example, the acoustic wave resonator connected closest to the capacitor C2 of the at least two acoustic wave resonators, and specifically includes the series arm resonator S14. That is, the gap between the adjacent electrode fingers of the comb-shaped capacitance electrode defining the capacitor C2 may be larger than a gap between adjacent electrode fingers of the IDT electrode defining the series arm resonator S14.

Since the gap between the adjacent electrode fingers of the comb-shaped capacitance electrode defining the capacitor C2 is large, the influence of the manufacturing variations that is a fixed value decreases.

As described above, since the gap between the adjacent electrode fingers of the comb-shaped capacitance electrode defining not only the capacitor C1 but also the capacitor C2 is large, the capacitance of the comb-shaped capacitance electrode defining the capacitor C2 is also less likely to shift with respect to a design value, and the deterioration in the improvement of the attenuation characteristics or the isolation characteristics due to the additional circuit 11 can be further reduced or prevented.

Further, for example, a gap between a tip portion of a plurality of electrode fingers of the comb-shaped capacitance electrode defining the capacitor C2 and a busbar electrode facing the tip portion may be larger than the gap between the tip portion of the plurality of electrode fingers of the IDT electrode defining the at least one acoustic wave resonator and a busbar electrode facing the tip portion.

At least one acoustic wave resonator for the capacitor C2 includes, for example, the acoustic wave resonator connected closest to the capacitor C2 of the at least two acoustic wave resonators, and specifically includes the series arm resonator S14. That is, the gap between the tip portion of the plurality of electrode fingers of the comb-shaped capacitance electrode defining the capacitor C2 and the busbar electrode facing the tip portion may be larger than a gap between a tip portion of a plurality of electrode fingers of the IDT electrode defining the series arm resonator S14 and a busbar electrode facing the tip portion.

Since the gap between the tip portion of the plurality of electrode fingers of the comb-shaped capacitance electrode defining the capacitor C2 and the busbar electrode facing the tip portion is large, the influence of the manufacturing variations that is a fixed value decreases.

As described above, since the gap between the tip portion of the plurality of electrode fingers of the comb-shaped capacitance electrode defining not only the capacitor C1 but also the capacitor C2 and the busbar electrode facing the tip portion is large, the capacitance of the comb-shaped capacitance electrode defining the capacitor C2 is less likely to shift with respect to the design value, and the deterioration in the improvement function of the attenuation characteristics or the isolation characteristics due to the additional circuit 11 can be further reduced or prevented.

Further, for example, a gap between the tip portion of the plurality of electrode fingers of the comb-shaped capacitance electrode defining the capacitor C2 and a dummy electrode facing the tip portion may be larger than the gap between the tip portion of the plurality of electrode fingers of the IDT electrode defining the at least one acoustic wave resonator and a dummy electrode facing the tip portion.

At least one acoustic wave resonator for the capacitor C2 includes, for example, the acoustic wave resonator connected closest to the capacitor C2 of the at least two acoustic wave resonators, and specifically includes the series arm resonator S14. That is, the gap between the tip portion of the plurality of electrode fingers of the comb-shaped capacitance electrode defining the capacitor C2 and the dummy electrode facing the tip portion may be larger than a gap between the tip portion of the plurality of electrode fingers of the IDT electrode defining the series arm resonator S14 and a dummy electrode facing the tip portion.

Since the gap between the tip portion of the plurality of electrode fingers of the comb-shaped capacitance electrode defining the capacitor C2 and the dummy electrode facing the tip portion is large, the influence of the manufacturing variations that is a fixed value decreases.

As described above, since the gap between the tip portion of the plurality of electrode fingers of the comb-shaped capacitance electrode forming not only the capacitor C1 but also the capacitor C2 and the dummy electrode facing the tip portion is large, the capacitance of the comb-shaped capacitance electrode defining the capacitor C2 is less likely to shift with respect to the design value, and the deterioration in the improvement function of the attenuation characteristics or the isolation characteristics due to the additional circuit 11 can be further reduced or prevented.

Note that, the reason why the series arm S11 is used as the comparison target with the capacitor C1, for the capacitance, the gap between the adjacent electrode fingers, and the gap between the tip portion of the plurality of electrode fingers and the busbar electrode or the dummy electrode facing the tip portion, is that the series arm resonator S11 is an acoustic wave resonator at a first stage for the input/output terminal 31, connected closest to the input/output terminal 31 of the acoustic wave resonators, and is an acoustic wave resonator that easily has an influence on the bandpass characteristic and the attenuation characteristics of the filter 10.

Further, the reason why the series arm S14 is used as the comparison target with the capacitor C2, for the capacitance, the gap between the adjacent electrode fingers, and the gap between the tip portion of the plurality of electrode fingers and the busbar electrode or the dummy electrode facing the tip portion, is that the series arm resonator S14 is an acoustic wave resonator at a first stage for the input/output terminal 32, connected closest to the input/output terminal 32 of the acoustic wave resonators, and is an acoustic wave resonator that easily has an influence on the bandpass characteristic and the attenuation characteristics of the filter 10.

The filter device 100 can be applied to a multiplexer, for example. A multiplexer to which the filter device 100 is applied will be described with reference to FIG. 6.

Figure 6:
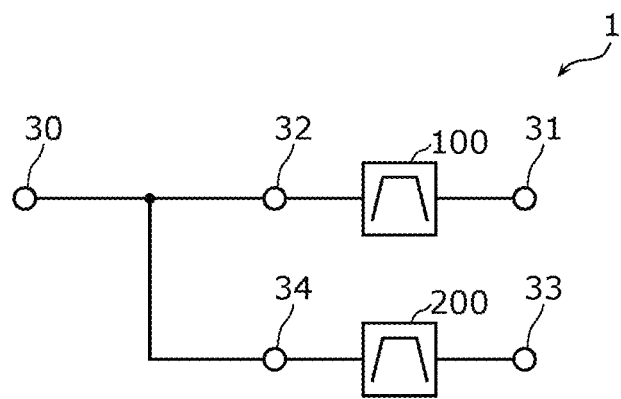
FIG. 6 is a configuration diagram illustrating an example of a multiplexer according to Preferred Embodiment 1 of the present invention.

FIG. 6 is a diagram illustrating an example of a multiplexer 1 according to Preferred Embodiment 1.

The multiplexer 1 includes a plurality of filters including the filter device 100, and an input terminal or an output terminal of the plurality of filters is connected to a common terminal 30. The plurality of filters includes, for example, the filter device 100 and a filter device 200. That is, in the present preferred embodiment, the multiplexer 1 is a duplexer constituted by two filter devices, that is, the filter devices 100 and 200, as the plurality of filters. In the present preferred embodiment, the input/output terminal 32 and an input/output terminal 34 are commonly connected to the common terminal 30 as input terminals or output terminals of the plurality of filters, but the input/output terminal 31 and an input/output terminal 33 may be commonly connected to the common terminal 30.

The common terminal 30 is commonly provided for the filter devices 100 and 200. The common terminal 30 is connected to an antenna element. That is, the common terminal 30 is also an antenna terminal of the multiplexer 1.

The input/output terminal 31 of the filter device 100 and the input/output terminal 33 of the filter device 200 are connected to an RF signal processing circuit with a switch IC, an amplification circuit, and the like interposed therebetween.

The multiplexer 1 is defined by the two filter devices as the plurality of filters, but may be defined by three or more filter devices.

The multiplexer 1 includes one filter device 100, but may include two or more filter devices 100 having pass bands different from each other.

As described above, according to the multiplexer 1 provided with the filter device 100, it is possible to reduce or prevent the deterioration in the bandpass characteristic due to the additional circuit 11.

Preferred Embodiment 2

Next, Preferred Embodiment 2 of the present invention will be described with reference to FIG. 7.

Figure 7:
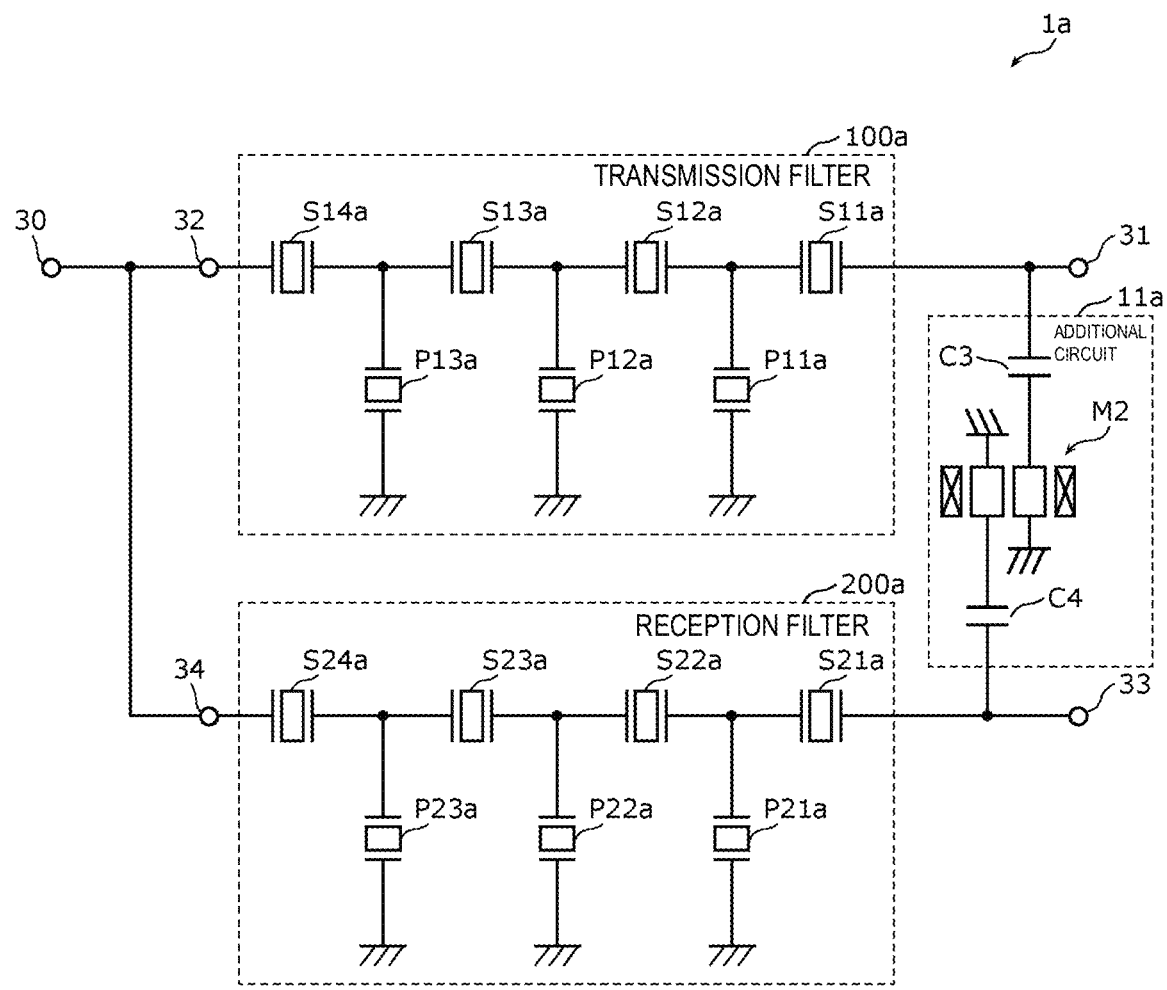
FIG. 7 is a configuration diagram illustrating an example of a multiplexer according to Preferred Embodiment 2 of the present invention.

FIG. 7 is a diagram illustrating an example of a multiplexer 1a according to Preferred Embodiment 2.

The multiplexer 1a includes the input/output terminal 31 defining and functioning as a first input terminal, the input/output terminal 32 defining and functioning as a first output terminal, the input/output terminal 33 defining and functioning as a second output terminal, the input/output terminal 34 defining and functioning as a second input terminal, and the common terminal 30. The input/output terminals 32 and 34 are connected to the common terminal 30 connected to an antenna element, and the input/output terminals 31 and 33 are each connected to an RF signal processing circuit with a switch IC, an amplification circuit, or the like interposed therebetween.

The multiplexer 1a includes a transmission filter 100a, a reception filter 200a, and an additional circuit 11a.

The transmission filter 100a is an acoustic wave filter provided between the input/output terminal 31 and the input/output terminal 32. The transmission filter 100a includes at least two transmission side acoustic wave resonators defining a pass band of the transmission filter 100a. The at least two transmission side acoustic wave resonators each include a piezoelectric body and an IDT electrode including a plurality of electrode fingers provided on the piezoelectric body. Here, the transmission filter 100a includes, as the at least two transmission side acoustic wave resonators, series arm resonators S11a, S12a, S13a, and S14a, and parallel arm resonators P11a, P12a, and P13a. The series arm resonators S11a, S12a, S13a, and S14a are disposed on the path connecting the input/output terminal 31 and the input/output terminal 32, and are connected in series with each other. The parallel arm resonator P11a is connected between a connection node between the series arm resonator S11a and the series arm resonator S12a, and the ground. The parallel arm resonator P12a is connected between a connection node between the series arm resonator S12a and the series arm resonator S13a, and the ground. The parallel arm resonator P13a is connected between a connection node between the series arm resonator S13a and the series arm resonator S14a, and the ground.

Note that, the number of the series arm resonators and the number of the parallel arm resonators in the transmission filter 100a need not be those illustrated in FIG. 7, and it is sufficient that the transmission filter 100a includes at least two series arm resonators, at least two parallel arm resonators, or at least one series arm resonator and at least one parallel arm resonator.

The reception filter 200a is an acoustic wave filter provided between the input/output terminal 34 and the input/output terminal 33. The reception filter 200a includes at least two reception side acoustic wave resonators defining a pass band of the reception filter 200a. The at least two reception side acoustic wave resonators each include a piezoelectric body and an IDT electrode including a plurality of electrode fingers provided on the piezoelectric body. Here, the reception filter 200a includes, as the at least two reception side acoustic wave resonators, series arm resonators S21a, S22a, S23a, and S24a, and parallel arm resonators P21a, P22a, and P23a. The series arm resonators S21a, S22a, S23a, and S24a are disposed on a path connecting the input/output terminal 33 and the input/output terminal 34, and are connected in series with each other. The parallel arm resonator P21a is connected between a connection node between the series arm resonator S21a and the series arm resonator S22a, and the ground. The parallel arm resonator P22a is connected between a connection node between the series arm resonator S22a and the series arm resonator S23a, and the ground. The parallel arm resonator P23a is connected between a connection node between the series arm resonator S23a and the series arm resonator S24a, and the ground.

Note that, the number of the series arm resonators and the number of the parallel arm resonators in the reception filter 200a need not be those illustrated in FIG. 7, and it is sufficient that the reception filter 200a includes at least two series arm resonators, at least two parallel arm resonators, or at least one series arm resonator and at least one parallel arm resonator.

Here, it is preferable to perform CA (carrier aggregation) in which the transmission filter 100a and the reception filter 200a are commonly connected to each other by the common terminal 30, and signals in a plurality of frequency bands corresponding to each of the transmission filter 100a and the reception filter 200a are simultaneously transmitted and received. At this time, for example, it is necessary to improve attenuation characteristics of the reception filter 200a in a frequency band corresponding to a pass band of the transmission filter 100a, so that a transmission signal in the pass band of the transmission filter 100a does not leak to the reception filter 200a with the input/output terminals 32 and 34 interposed therebetween.

Thus, the additional circuit 11a is provided. The additional circuit 11a is provided between the input/output terminal 31 and the input/output terminal 33, and one end thereof is connected on a path connecting the input/output terminals 31 and 32, and another end thereof is connected on a path connecting the input/output terminals 33 and 34. For example, the one end of the additional circuit 11a is connected to the input/output terminal 31, and the other end thereof is connected to the input/output terminal 33. The additional circuit 11a generates a signal that has a phase opposite to that of an unnecessary signal in a frequency band corresponding to the pass band of the transmission filter 100a, the unnecessary signal leaking from the transmission filter 100a to the reception filter 200a, and that is a cancellation signal to cancel the unnecessary signal. The unnecessary signal leaking to the reception filter 200a is canceled by the cancellation signal generated by the additional circuit 11 at a connection point between the reception filter 200a and the additional circuit 11a. Accordingly, attenuation characteristics of the reception filter 200a are improved in the frequency band corresponding to the pass band of the transmission filter 100a.

For example, one end of the additional circuit 11a need not be connected to a node between the input/output terminal 31 and the series arm resonator S11a, and may be connected to a node between the series arm resonator S11a and the series arm resonator S12a, a node between the series arm resonator S12a and the series arm resonator S13a, or a node between the series arm resonator S13a and the series arm resonator S14a. Further, the other end of the additional circuit 11a need not be connected to a node between the input/output terminal 33 and the series arm resonator S21a, and may be connected to a node between the series arm resonator S21a and the series arm resonator S22a, a node between the series arm resonator S22a and the series arm resonator S23a, or a node between the series arm resonator S23a and the series arm resonator S24a.

The additional circuit 11a includes a longitudinally coupled resonator M2 that is a phase shift circuit, and a third capacitor provided at one section either between the longitudinally coupled resonator M2 and the input/output terminal or between the longitudinally coupled resonator M2 and the input/output terminal 33. For example, here, the additional circuit 11a includes, as the third capacitor, a capacitor C3 provided between the longitudinally coupled resonator M2 and the input/output terminal 31. In addition, the additional circuit 11a further includes a fourth capacitor provided at another section either between the longitudinally coupled resonator M2 and the input/output terminal 31 or between the longitudinally coupled resonator M2 and the input/output terminal 33. For example, here, the additional circuit 11a includes, as the fourth capacitor, a capacitor C4 provided between the longitudinally coupled resonator M2 and the input/output terminal 33. The longitudinally coupled resonator M2 and the capacitors C3 and C4 are configured to generate a cancellation signal. Note that, the capacitor C3 may be the fourth capacitor, and the capacitor C4 may be the third capacitor.

The capacitors C3 and C4 are elements that, in order to generate a cancellation signal having an amplitude the same or substantially the same as that of an unnecessary signal flowing through the reception filter 200a, adjust (specifically, reduce) the amplitude of an inputted signal. The capacitors C3 and C4 each include a piezoelectric body and a comb-shaped capacitance electrode including a plurality of electrode fingers provided on the piezoelectric body.

The longitudinally coupled resonator M2 is a phase shift circuit that, in order to generate a cancellation signal having a phase opposite to and an amplitude the same or substantially the same as those of an unnecessary signal, adjusts the amplitude and the phase of an inputted signal. Note that, as in Preferred Embodiment 1, the phase shift circuit may be a transversal filter, or may be an acoustic wave delay line, for example.

The respective comb-shaped capacitance electrodes defining the capacitors C3 and C4, the respective IDT electrodes defining the at least two transmission side acoustic wave resonators in the transmission filter 100a, and the respective IDT electrodes defining the at least two reception side acoustic wave resonators in the reception filter 200a are provided on the same piezoelectric body with each other. Note that, the longitudinally coupled resonator M2 may also be provided on the same piezoelectric body. The structure of the respective comb-shaped capacitance electrodes defining the capacitors C3 and C4, the respective IDT electrodes defining the at least two transmission side acoustic wave resonators, and the respective IDT electrodes defining the at least two reception side acoustic wave resonators preferably has, for example, the structure illustrated in FIGS. 3A and 3B, or FIG. 4.

The additional circuit 11a can cancel an unnecessary signal leaking from the transmission filter 100a to the reception filter 200a, thus improving the attenuation characteristics of the reception filter 200a. On the other hand, a signal corresponding to the pass band of the transmission filter 100a flowing through the transmission filter 100a may leak to the additional circuit 11a, and a bandpass characteristic of the transmission filter 100a may deteriorate.

Thus, in the present preferred embodiment, the capacitance of the comb-shaped capacitance electrode defining the capacitor C3 is smaller than the capacitance of the IDT electrode defining at least one acoustic wave resonator of the at least two transmission side acoustic wave resonators and the at least two reception side acoustic wave resonators. In order to reduce the capacitance of the comb-shaped capacitance electrode, when the surface of the piezoelectric body on which the IDT electrode and the comb-shaped capacitance electrode are provided is viewed in plan, an area of the comb-shaped capacitance electrode defining the capacitor C3 is smaller than an area of the IDT electrode defining the at least one acoustic wave resonator.

The at least one acoustic wave resonator for the capacitor C3 includes, for example, an acoustic wave resonator connected closest to the capacitor C3 of the at least two transmission side acoustic wave resonators, and specifically includes the series arm resonator S11a. That is, the capacitance of the comb-shaped capacitance electrode defining the capacitor C3 is smaller than capacitance of an IDT electrode defining the series arm resonator S11a, and the area of the comb-shaped capacitance electrode defining the capacitor C3 is smaller than an area of the IDT electrode defining the series arm resonator S11a.

As described above, the capacitance of the comb-shaped capacitance electrode defining the capacitor C3 is small, and thus a signal corresponding to the pass band of the transmission filter 100a flowing through the transmission filter 100a is less likely to leak to the additional circuit 11a, and deterioration in a bandpass characteristic due to the additional circuit 11a can be reduced or prevented.

Note that, when the third capacitor is the capacitor C4 provided between the longitudinally coupled resonator M2 and the input/output terminal 33, at least one acoustic wave resonator for the capacitor C4 includes, for example, an acoustic wave resonator connected closest to the capacitor C4 of the at least two reception side acoustic wave resonators, and specifically includes the series arm resonator S21a. That is, a capacitance of a comb-shaped capacitance electrode defining the capacitor C4 as the third capacitor is smaller than a capacitance of an IDT electrode defining the series arm resonator S21a, and an area of the comb-shaped capacitance electrode defining the capacitor C4 is smaller than an area of the IDT electrode defining the series arm resonator S21a.

Further, in the present preferred embodiment in which the third capacitor is the capacitor C3, the capacitance of the comb-shaped capacitance electrode defining the capacitor C4 as the fourth capacitor is smaller than the capacitance of the IDT electrode defining the at least one acoustic resonator of the at least two transmission side acoustic wave resonators and the at least two reception side acoustic wave resonators. In order to reduce the capacitance of the comb-shaped capacitance electrode, when the surface of the piezoelectric body on which the IDT electrode and the comb-shaped capacitance electrode are provided is viewed in plan, the area of the comb-shaped capacitance electrode defining the capacitor C4 is smaller than the area of the IDT electrode defining the at least one acoustic wave resonator.

The at least one acoustic wave resonator for the capacitor C4 includes, for example, the acoustic wave resonator connected closest to the capacitor C4 of the at least two reception side acoustic wave resonators, and specifically includes the series arm resonator S21a. That is, the capacitance of the comb-shaped capacitance electrode defining the capacitor C4 is smaller than the capacitance of the IDT electrode defining the series arm resonator S21a, and the area of the comb-shaped capacitance electrode defining the capacitor C4 is smaller than the area of the IDT electrode defining the series arm resonator S21a.

As described above, the capacitance of the comb-shaped capacitance electrode defining the capacitor C4 is smaller than the capacitance of the IDT electrode defining the series arm resonator S21a, and thus a signal corresponding to the pass band of the transmission filter 100a inputted to the input/output terminal 31 is further less likely to flow through the additional circuit 11a on the side of the longitudinally coupled resonator M2 with respect to the capacitor C3 by the two capacitors C3 and C4 each having small capacitances. Accordingly, a signal corresponding to the pass band of the transmission filter 100a flowing through the transmission filter 100a is further less likely to leak to the additional circuit 11a, and thus the deterioration in the bandpass characteristic due to the additional circuit 11a can be further reduced or prevented.

In the present preferred embodiment, as described above, the respective comb-shaped capacitance electrodes defining the capacitors C3 and C4, and the IDT electrode defining the at least one acoustic wave resonator are provided in the same piezoelectric body, and are manufactured in the same process. That is, manufacturing variations for the respective comb-shaped capacitance electrodes defining the capacitors C3 and C4, and the IDT electrode defining the at least one acoustic wave resonator are the same or substantially the same. As described above, since the area of each of the respective comb-shaped capacitance electrodes defining the capacitors C3 and C4 is smaller than the area of the IDT electrode defining the at least one acoustic wave resonator, influence of the manufacturing variation for the comb-shaped capacitance electrodes having the small area is larger than influence of the manufacturing variation for the IDT electrode having the large area. Thus, due to the influence by the manufacturing variations, the capacitance of the respective comb-shaped capacitance electrodes defining the capacitors C3 and C4 may vary greatly, and a cancellation signal generated by the additional circuit 11a may not be an exact signal as designed, and an improvement of the attenuation characteristics or the isolation characteristics by the additional circuit 11a may deteriorate.

Thus, for example, a gap between electrode fingers adjacent to each other of the comb-shaped capacitance electrode defining the capacitor C3 may be larger than a gap between electrode fingers adjacent to each other of the IDT electrode defining the at least one acoustic wave resonator.

The at least one acoustic wave resonator for the capacitor C3 includes, for example, the acoustic wave resonator connected closest to the capacitor C3 of the at least two transmission side acoustic wave resonators, and specifically includes the series arm resonator S11a. That is, the gap between adjacent electrode fingers of the comb-shaped capacitance electrode defining the capacitor C3 may be larger than a gap between adjacent electrode fingers of the IDT electrode defining the series arm resonator S11a.

Since the gap between the adjacent electrode fingers of the comb-shaped capacitance electrode defining the capacitor C3 is large, the influence of the manufacturing variations that is a fixed value decreases.

As described above, since the gap between the adjacent electrode fingers of the comb-shaped capacitance electrode defining the capacitor C3 is large, the capacitance of the comb-shaped capacitance electrode defining the capacitor C3 is less likely to shift with respect to a design value, in other words, it is easy to generate a cancellation signal that exactly matches a design value, and the deterioration in the improvement of the attenuation characteristics or the isolation characteristics due to the additional circuit 11a can be reduced or prevented.

Further, for example, a gap between a tip portion of a plurality of electrode fingers of the comb-shaped capacitance electrode defining the capacitor C3 and a busbar electrode facing the tip portion may be larger than a gap between a tip portion of the plurality of electrode fingers of the IDT electrode defining the at least one acoustic wave resonator and a busbar electrode facing the tip portion.

The at least one acoustic wave resonator for the capacitor C3 includes, for example, the acoustic wave resonator connected closest to the capacitor C3 of the at least two transmission side acoustic wave resonators, and specifically includes the series arm resonator S11a. That is, the gap between the tip portion of the plurality of electrode fingers of the comb-shaped capacitance electrode defining the capacitor C3 and the busbar electrode facing the tip portion may be larger than a gap between a tip portion of the plurality of electrode fingers of the IDT electrode defining the series arm resonator S11a and a busbar electrode facing the tip portion.

Since the gap between the tip portion of the plurality of electrode fingers of the comb-shaped capacitance electrode defining the capacitor C3 and the busbar electrode facing the tip portion is large, the influence of the manufacturing variations that is a fixed value decreases.

As described above, since the gap between the tip portion of the plurality of electrode fingers of the comb-shaped capacitance electrode defining the capacitor C3 and the busbar electrode facing the tip portion is large, the capacitance of the comb-shaped capacitance electrode defining the capacitor C3 is less likely to shift with respect to the design value, in other words, it is easy to generate a cancellation signal that exactly matches a design value, and the deterioration in the improvement of the attenuation characteristics or the isolation characteristics due to the additional circuit 11a can be reduced or prevented.

Further, for example, a gap between the tip portion of the plurality of electrode fingers of the comb-shaped capacitance electrode defining the capacitor C3 and a dummy electrode facing the tip portion may be larger than a gap between the tip portion of the plurality of electrode fingers of the IDT electrode defining the at least one acoustic wave resonator and a dummy electrode facing the tip portion.

The at least one acoustic wave resonator for the capacitor C3 includes, for example, the acoustic wave resonator connected closest to the capacitor C3 of the at least two transmission side acoustic wave resonators, and specifically includes the series arm resonator S11a. That is, the gap between the tip portion of the plurality of electrode fingers of the comb-shaped capacitance electrode defining the capacitor C3 and the dummy electrode facing the tip portion may be larger than a gap between the tip portion of the plurality of electrode fingers of the IDT electrode defining the series arm resonator S11a and a dummy electrode facing the tip portion.

Since the gap between the tip portion of the plurality of electrode fingers of the comb-shaped capacitance electrode defining the capacitor C3 and the dummy electrode facing the tip portion is large, the influence of the manufacturing variations that is a fixed value decreases.

As described above, since the gap between the tip portion of the plurality of electrode fingers of the comb-shaped capacitance electrode defining the capacitor C3 and the dummy electrode facing the tip portion is large, the capacitance of the comb-shaped capacitance electrode defining the capacitor C3 is less likely to shift with respect to the design value, in other words, it is easy to generate a cancellation signal that exactly matches a design value, and the deterioration in the improvement of the attenuation characteristics or the isolation characteristics due to the additional circuit 11a can be reduced or prevented.

Further, for example, a gap between electrode fingers adjacent to each other of the comb-shaped capacitance electrode defining the capacitor C4 may be larger than a gap between electrode fingers adjacent to each other of the IDT electrode defining the at least one acoustic wave resonator.

The at least one acoustic wave resonator for the capacitor C4 includes, for example, the acoustic wave resonator connected closest to the capacitor C4 of the at least two reception side acoustic wave resonators, and specifically includes the series arm resonator S21a. That is, the gap between adjacent electrode fingers of the comb-shaped capacitance electrode defining the capacitor C4 may be larger than a gap between adjacent electrode fingers of the IDT electrode defining the series arm resonator S21a.

Since the gap between the adjacent electrode fingers of the comb-shaped capacitance electrode defining the capacitor C4 is large, the influence of the manufacturing variations that is a fixed value decreases.

As described above, since the gap between the adjacent electrode fingers of the comb-shaped capacitance electrode forming not only the capacitor C3 but also the capacitor C4 is large, the capacitance of the comb-shaped capacitance electrode defining the capacitor C4 is also less likely to shift with respect to a design value, and the deterioration in the improvement of the attenuation characteristics or the isolation characteristics due to the additional circuit 11a can be further reduced or prevented.

Further, for example, a gap between a tip portion of a plurality of electrode fingers of the comb-shaped capacitance electrode defining the capacitor C4 and a busbar electrode facing the tip portion may be larger than a gap between a tip portion of the plurality of electrode fingers of the IDT electrode defining the at least one acoustic wave resonator and a busbar electrode facing the tip portion.

The at least one acoustic wave resonator for the capacitor C4 includes, for example, the acoustic wave resonator connected closest to the capacitor C4 of the at least two reception side acoustic wave resonators, and specifically includes the series arm resonator S21a. That is, the gap between the tip portion of the plurality of electrode fingers of the comb-shaped capacitance electrode defining the capacitor C4 and the busbar electrode facing the tip portion may be larger than a gap between a tip portion of the plurality of electrode fingers of the IDT electrode defining the series arm resonator S21a and a busbar electrode facing the tip portion.

Since the gap between the tip portion of the plurality of electrode fingers of the comb-shaped capacitance electrode defining the capacitor C4 and the busbar electrode facing the tip portion is large, the influence of the manufacturing variations that is a fixed value decreases.

As described above, since the gap between the tip portion of the plurality of electrode fingers of the comb-shaped capacitance electrode forming not only the capacitor C3 but also the capacitor C4 and the busbar electrode facing the tip portion is large, the capacitance of the comb-shaped capacitance electrode defining the capacitor C4 is less likely to shift with respect to the design value, and the deterioration in the improvement of the attenuation characteristics or the isolation characteristics due to the additional circuit 11a can be further reduced or prevented.

Further, for example, a gap between the tip portion of the plurality of electrode fingers of the comb-shaped capacitance electrode defining the capacitor C4 and a dummy electrode facing the tip portion may be larger than a gap between the tip portion of the plurality of electrode fingers of the IDT electrode defining the at least one acoustic wave resonator and a dummy electrode facing the tip portion.

The at least one acoustic wave resonator for the capacitor C4 includes, for example, the acoustic wave resonator connected closest to the capacitor C4 of the at least two reception side acoustic wave resonators, and specifically includes the series arm resonator S21a. That is, the gap between the tip portion of the plurality of electrode fingers of the comb-shaped capacitance electrode defining the capacitor C4 and the dummy electrode facing the tip portion may be larger than a gap between the tip portion of the plurality of electrode fingers of the IDT electrode defining the series arm resonator S21a and a dummy electrode facing the tip portion.

Since the gap between the tip portion of the plurality of electrode fingers of the comb-shaped capacitance electrode defining the capacitor C4 and the dummy electrode facing the tip portion is large, the influence of the manufacturing variations that is a fixed value decreases.

As described above, since the gap between the tip portion of the plurality of electrode fingers of the comb-shaped capacitance electrode forming not only the capacitor C3 but also the capacitor C4 and the dummy electrode facing the tip portion is large, the capacitance of the comb-shaped capacitance electrode defining the capacitor C4 is less likely to shift with respect to the design value, and the deterioration in the improvement of the attenuation characteristics or the isolation characteristics due to the additional circuit 11a can be further reduced or prevented.

Note that, the reason why the series arm Shia is used as the comparison target with the capacitor C3, for the capacitance, the gap between the adjacent electrode fingers, and the gap between the tip portion of the plurality of electrode fingers and the busbar electrode or the dummy electrode facing the tip portion, is that the series arm resonator Shia is an acoustic wave resonator at a first stage for the input/output terminal 31, connected closest to the input/output terminal 31 of the acoustic wave resonators, and is an acoustic wave resonator that easily has an influence on the bandpass characteristic and the attenuation characteristics of the transmission filter 100a.

Further, the reason why the series arm S21a is used as the comparison target with the capacitor C4, for the capacitance, the gap between the adjacent electrode fingers, and the gap between the tip portion of the plurality of electrode fingers and the busbar electrode or the dummy electrode facing the tip portion, is that the series arm resonator S21a is an acoustic wave resonator at a first stage for the input/output terminal 33, connected closest to the input/output terminal 33 of the acoustic wave resonators, and is an acoustic wave resonator that easily has an influence on the bandpass characteristic and the attenuation characteristics of the reception filter 200a.

Note that, the multiplexer 1a may include a filter that is commonly connected to the common terminal 30, in addition to the transmission filter 100a and the reception filter 200a.

Although the filter devices and the multiplexers according to preferred embodiments of the present invention have been described above, the present invention also includes other preferred embodiments obtained by combining elements in the above-described preferred embodiments, modified examples obtained by performing various modifications that are conceivable by a person skilled in the art without departing from the spirit of the present invention for the preferred embodiments described above, and various devices including the filter devices and the multiplexers according to preferred embodiments of the present invention.

For example, in Preferred Embodiment 1, it has been described that the at least one acoustic wave resonator in the filter 10 for the capacitor C1 includes the series arm resonator S11 connected closest to the capacitor C1, but the present invention is not limited thereto. For example, the at least one acoustic wave resonator in the filter 10 for the capacitor C1 need not include the series arm resonator S11 in the filter 10, and may include an acoustic wave resonator other than the series arm resonator S11.

Further, for example, in Preferred Embodiment 1, it has been described that the at least one acoustic wave resonator in the filter 10 for the capacitor C2 includes the series arm resonator S14 connected closest to the capacitor C2, but the present invention is not limited thereto. For example, the at least one acoustic wave resonators in the filter 10 for the capacitor C2 need not include the series arm resonator S14 in the filter 10, and may include an acoustic wave resonator other than the series arm resonator S14.

Further, for example, in Preferred Embodiment 1, it has been described that the filter device 100 includes the capacitor C2, but the filter device 100 need not include the capacitor C2.

Further, for example, in Preferred Embodiment 2, it has been described that the at least one acoustic wave resonator in the transmission filter 100a and the reception filter 200a for the capacitor C3 includes the series arm resonator S11a connected closest to the capacitor C3, but the present invention is not limited to this. For example, the at least one acoustic wave resonator in the transmission filter 100a and the reception filter 200a for the capacitor C3 need not include the series arm resonator S11a, and may include an acoustic wave resonator other than the series arm resonator S11a in the transmission filter 100a.

Further, for example, in Preferred Embodiment 2, it has been described that the at least one acoustic wave resonator in the transmission filter 100a and the reception filter 200a for the capacitor C4 includes the series arm resonator S21a connected closest to the capacitor C4, but the present invention is not limited to this. For example, the at least one acoustic wave resonator in the transmission filter 100a and the reception filter 200a for the capacitor C4 need not include the series arm resonator S21a, and may include an acoustic wave resonator other than the series arm resonator S21a in the reception filter 200a.

Further, for example, in Preferred Embodiment 2, the additional circuit 11a has been described as including the capacitors C3 and C4, but it is also possible that any one of the capacitors C3 and C4 is not included.

Preferred embodiments of the present invention can be widely used as filter devices and multiplexers in communication devices, such as a mobile phone.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A filter device, comprising:
an acoustic wave filter provided between a first input/output terminal and a second input/output terminal; and
an additional circuit connected in parallel with the acoustic wave filter between the first input/output terminal and the second input/output terminal; wherein
the acoustic wave filter includes at least two acoustic wave resonators defining a pass band of the acoustic wave filter;
the additional circuit includes:
a phase shift circuit; and
a first capacitor connected between the phase shift circuit and the first input/output terminal;
the at least two acoustic wave resonators each include a piezoelectric body and an IDT electrode including a plurality of electrode fingers provided on the piezoelectric body;
the first capacitor includes the piezoelectric body and a comb-shaped capacitance electrode including a plurality of electrode fingers provided on the piezoelectric body;
a capacitance of the comb-shaped capacitance electrode of the first capacitor is smaller than a capacitance of the IDT electrode of at least one acoustic wave resonator of the at least two acoustic wave resonators;
when a surface of the piezoelectric body on which the IDT electrode and the comb-shaped capacitance electrode are provided is viewed in plan, an area of the comb-shaped capacitance electrode of the first capacitor is smaller than an area of the IDT electrode of the at least one acoustic wave resonator;
a gap between electrode fingers adjacent to each other of the comb-shaped capacitance electrode of the first capacitor is larger than a gap between electrode fingers adjacent to each other of the IDT electrode of the at least one acoustic wave resonator; and
a gap between a tip portion of a plurality of electrode fingers of the comb-shaped capacitance electrode of the first capacitor and a busbar electrode or a dummy electrode facing the tip portion is larger than a gap between a tip portion of a plurality of electrode fingers of the IDT electrode of the at least one acoustic wave resonator and a busbar electrode or a dummy electrode facing the tip portion.
2. The filter device according to claim 1, wherein the at least one acoustic wave resonator includes an acoustic wave resonator connected closest to the first capacitor of the at least two acoustic wave resonators.

3. The filter device according to claim 1, wherein
the additional circuit further includes a second capacitor connected between the phase shift circuit and the second input/output terminal;
the second capacitor includes the piezoelectric body and a comb-shaped capacitance electrode including a plurality of electrode fingers provided on the piezoelectric body;
a capacitance of the comb-shaped capacitance electrode of the second capacitor is smaller than the capacitance of the IDT electrode of the at least one acoustic wave resonator; and
when the surface of the piezoelectric body on which the IDT electrode and the comb tooth capacitance electrode are provided is viewed in plan, an area of the comb-shaped capacitance electrode of the second capacitor is smaller than the area of the IDT electrode of the at least one acoustic wave resonator.

4. The filter device according to claim 3, wherein a gap between electrode fingers adjacent to each other of the comb-shaped capacitance electrode of the second capacitor is larger than the gap between the electrode fingers adjacent to each other of the IDT electrode of the at least one acoustic wave resonator.

5. The filter device according to claim 3, wherein a gap between a tip portion of a plurality of electrode fingers of the comb-shaped capacitance electrode of the second capacitor and a busbar electrode or a dummy electrode facing the tip portion is larger than the gap between the tip portion of the plurality of electrode fingers of the IDT electrode of the at least one acoustic wave resonator and the busbar electrode or the dummy electrode facing the tip portion.

6. The filter device according to claim 3, wherein the at least one acoustic wave resonator includes an acoustic wave resonator connected closest to the second capacitor of the at least two acoustic wave resonators.

7. The filter device according to claim 1, wherein the phase shift circuit includes a longitudinally coupled resonator.

8. A multiplexer, comprising:
a plurality of filters including the filter device according to claim 1; wherein
an input terminal or an output terminal of the plurality of filters is connected to a common terminal.

9. A multiplexer, comprising:
a transmission filter provided between a first input terminal and a first output terminal;
a reception filter provided between a second input terminal and a second output terminal; and
an additional circuit provided between the first input terminal and the second output terminal; wherein
the first output terminal and the second input terminal are connected to a common terminal;
the transmission filter includes at least two transmission side acoustic wave resonators defining a pass band of the transmission filter;
the reception filter includes at least two reception side acoustic wave resonators defining a pass band of the reception filter;
the additional circuit includes:
  a phase shift circuit; and
  a third capacitor provided either between the phase shift circuit and the first input terminal or between the phase shift circuit and the second output terminal;
the at least two transmission side acoustic wave resonators each include a piezoelectric body and an IDT electrode including a plurality of electrode fingers provided on the piezoelectric body;
the at least two reception side acoustic wave resonators each include the piezoelectric body and an IDT electrode including a plurality of electrode fingers provided on the piezoelectric body;
the third capacitor includes the piezoelectric body and a comb-shaped capacitance electrode including a plurality of electrode fingers provided on the piezoelectric body;
a capacitance of the comb-shaped capacitance electrode of the third capacitor is smaller than a capacitance of the IDT electrode of at least one acoustic wave resonator of the at least two transmission side acoustic wave resonators and the at least two reception side acoustic wave resonators;
when a surface of the piezoelectric body on which the IDT electrode and the comb-shaped capacitance electrode are provided is viewed in plan, an area of the comb-shaped capacitance electrode of the third capacitor is smaller than an area of the IDT electrode of the at least one acoustic wave resonator;
a gap between electrode fingers adjacent to each other of the comb-shaped capacitance electrode of the third capacitor is larger than a gap between electrode fingers adjacent to each other of the IDT electrode of the at least one acoustic wave resonator; and
a gap between a tip portion of a plurality of electrode fingers of the comb-shaped capacitance electrode of the third capacitor and a busbar electrode or a dummy electrode facing the tip portion is larger than a gap between a tip portion of a plurality of electrode fingers of the IDT electrode of the at least one acoustic wave resonator and a busbar electrode or a dummy electrode facing the tip portion.

10. The multiplexer according to claim 9, wherein the third capacitor is provided between the phase shift circuit and the first input terminal, and the at least one acoustic wave resonator includes an acoustic wave resonator connected closest to the third capacitor of the at least two transmission side acoustic wave resonators.

11. The multiplexer according to claim 9, wherein the third capacitor is provided between the phase shift circuit and the second output terminal, and the at least one acoustic wave resonator includes an acoustic wave resonator connected closest to the third capacitor of the at least two reception side acoustic wave resonators.

12. The multiplexer according to claim 9, wherein
the additional circuit further includes a fourth capacitor provided between the phase shift circuit and the first input terminal or between the phase shift circuit and the second output terminal;
the fourth capacitor includes the piezoelectric body and a comb-shaped capacitance electrode including a plurality of electrode fingers provided on the piezoelectric body;
a capacitance of the comb-shaped capacitance electrode of the fourth capacitor is smaller than the capacitance of the IDT electrode of the at least one acoustic wave resonator; and
when the surface of the piezoelectric body on which the IDT electrode and the comb-shaped capacitance electrode are provided is viewed in plan, an area of the comb-shaped capacitance electrode of the fourth capacitor is smaller than the area of the IDT electrode of the at least one acoustic wave resonator.

13. The multiplexer according to claim 12, wherein a gap between electrode fingers adjacent to each other of the comb-shaped capacitance electrode of the fourth capacitor is larger than the gap between the electrode fingers adjacent to each other of the IDT electrode of the at least one acoustic wave resonator.

14. The multiplexer according to claim 12, wherein a gap between a tip portion of a plurality of electrode fingers of the comb-shaped capacitance electrode of the fourth capacitor and a busbar electrode or a dummy electrode facing the tip portion is larger than the gap between the tip portion of the plurality of electrode fingers of the IDT electrode of the at least one acoustic wave resonator and the busbar electrode or the dummy electrode facing the tip portion.

15. The multiplexer according to claim 12, wherein the fourth capacitor is provided between the phase shift circuit and the second output terminal, and the at least one acoustic wave resonator includes an acoustic wave resonator connected closest to the fourth capacitor of the at least two reception side acoustic wave resonators.

16. The multiplexer according to claim 12, wherein the fourth capacitor is provided between the phase shift circuit and the first input terminal, and the at least one acoustic wave resonator includes an acoustic wave resonator connected closest to the fourth capacitor of the at least two transmission side acoustic wave resonators.

17. The multiplexer according to claim 9, wherein the phase shift circuit includes a longitudinally coupled resonator.

18. A filter device, comprising:
an acoustic wave filter provided between a first input/output terminal and a second input/output terminal; and
an additional circuit connected in parallel with the acoustic wave filter between the first input/output terminal and the second input/output terminal; wherein
the acoustic wave filter includes at least two acoustic wave resonators defining a pass band of the acoustic wave filter;
the additional circuit includes:
a phase shift circuit; and
a first capacitor connected between the phase shift circuit and the first input/output terminal;
the at least two acoustic wave resonators each include a piezoelectric body and an IDT electrode including a plurality of electrode fingers provided on the piezoelectric body;
the first capacitor includes the piezoelectric body and a comb-shaped capacitance electrode including a plurality of electrode fingers provided on the piezoelectric body;
a capacitance of the comb-shaped capacitance electrode of the first capacitor is smaller than a capacitance of the IDT electrode of at least one acoustic wave resonator of the at least two acoustic wave resonators;
when a surface of the piezoelectric body on which the IDT electrode and the comb-shaped capacitance electrode are provided is viewed in plan, an area of the comb-shaped capacitance electrode of the first capacitor is smaller than an area of the IDT electrode of the at least one acoustic wave resonator; and
a gap between a tip portion of a plurality of electrode fingers of the comb-shaped capacitance electrode of the first capacitor and a busbar electrode or a dummy electrode facing the tip portion is larger than a gap between a tip portion of a plurality of electrode fingers of the IDT electrode of the at least one acoustic wave resonator and a busbar electrode or a dummy electrode facing the tip portion.

19. A multiplexer, comprising:
a transmission filter provided between a first input terminal and a first output terminal;
a reception filter provided between a second input terminal and a second output terminal; and
an additional circuit provided between the first input terminal and the second output terminal; wherein
the first output terminal and the second input terminal are connected to a common terminal;
the transmission filter includes at least two transmission side acoustic wave resonators defining a pass band of the transmission filter;
the reception filter includes at least two reception side acoustic wave resonators defining a pass band of the reception filter;
the additional circuit includes:
a phase shift circuit; and
a third capacitor provided either between the phase shift circuit and the first input terminal or between the phase shift circuit and the second output terminal;
the at least two transmission side acoustic wave resonators each include a piezoelectric body and an IDT electrode including a plurality of electrode fingers provided on the piezoelectric body;
the at least two reception side acoustic wave resonators each include the piezoelectric body and an IDT electrode including a plurality of electrode fingers provided on the piezoelectric body;
the third capacitor includes the piezoelectric body and a comb-shaped capacitance electrode including a plurality of electrode fingers provided on the piezoelectric body;
a capacitance of the comb-shaped capacitance electrode of the third capacitor is smaller than a capacitance of the IDT electrode of at least one acoustic wave resonator of the at least two transmission side acoustic wave resonators and the at least two reception side acoustic wave resonators;
when a surface of the piezoelectric body on which the IDT electrode and the comb-shaped capacitance electrode are provided is viewed in plan, an area of the comb-shaped capacitance electrode of the third capacitor is smaller than an area of the IDT electrode of the at least one acoustic wave resonator; and
a gap between a tip portion of a plurality of electrode fingers of the comb-shaped capacitance electrode of the third capacitor and a busbar electrode or a dummy electrode facing the tip portion is larger than a gap between a tip portion of a plurality of electrode fingers of the IDT electrode of the at least one acoustic wave resonator and a busbar electrode or a dummy electrode facing the tip portion.

* * * * *